(12) United States Patent
Jiang et al.

(10) Patent No.: US 7,706,476 B2
(45) Date of Patent: Apr. 27, 2010

(54) REAL-TIME DIGITAL QUADRATURE DEMODULATION METHOD AND DEVICE FOR ULTRASONIC IMAGING SYSTEM

(75) Inventors: Yong Jiang, Shenzhen (CN); Qinjun Hu, Shenzhen (CN); Xingjun Pi, Shenzhen (CN)

(73) Assignee: Shenzhen Mindray Bio-Medical Electronics Co., Ltd., Shenzhen (CN)

( * ) Notice: Subject to any disclaimer, the term of this patent is extended or adjusted under 35 U.S.C. 154(b) by 738 days.

(21) Appl. No.: 11/617,959

(22) Filed: Dec. 29, 2006

(65) Prior Publication Data
US 2008/0126460 A1    May 29, 2008

(30) Foreign Application Priority Data
Nov. 27, 2006    (CN) .................. 2006 1 0146980

(51) Int. Cl.
*H04L 27/00* (2006.01)
*G06F 17/10* (2006.01)
(52) U.S. Cl. ...................... 375/324; 708/322
(58) Field of Classification Search ............ 375/322, 375/324, 329, 340; 708/276, 300, 322
See application file for complete search history.

(56) References Cited

FOREIGN PATENT DOCUMENTS

| CA | 98202128.3 | 4/1999 |
|---|---|---|
| CA | 02134900.2 | 9/2003 |
| CA | 200510043854 | 12/2005 |

OTHER PUBLICATIONS

SIPO Search Report No. G062378, dated Nov. 7, 2006.
SIPO Search Report No. G062548, dated Nov. 30, 2006.

*Primary Examiner*—Khanh C Tran
(74) *Attorney, Agent, or Firm*—Kory D. Christensen; Stoel Rives LLP

(57) ABSTRACT

A real-time digital quadrature demodulation method and device for the ultrasonic imaging system are disclosed in this invention. In addition to a multiplying step and a filtering step, the method further comprises a sine and cosine table generating step for generating the sine and cosine table in real time, and a filter parameter generating step for generating corresponding filter parameters in real time to filter signals from the multipliers. The device comprises two multipliers, two filters, a sine and cosine table generating module, a filter parameter generating module, and two parameter memories. The real-time digital quadrature demodulation method and device for the ultrasonic imaging system according to the invention are capable of effectively saving the storage resource, and are easily controllable.

16 Claims, 5 Drawing Sheets

REAL-TIME DIGITAL QUADRATURE DEMODULATION METHOD AND DEVICE FOR ULTRASONIC IMAGING SYSTEM

STATEMENT OF RELATED APPLICATION

This application claims the priority of the Chinese patent application No. 200610146980.1, filed Nov. 27, 2006, entitled "Real-time Digital Quadrature Demodulation Method and Device for the Ultrasonic Imaging System", which is incorporated herein by reference in entirety.

FIELD OF THE INVENTION

This invention relates to a digital quadrature demodulation method and device, and in particular to a real-time digital quadrature demodulation method and device for the ultrasonic imaging system.

BACKGROUND OF THE INVENTION

The digital quadrature demodulation device is an indispensable part of an all-digital ultrasonic imaging system, and in particular an all-digital color Doppler ultrasonic imager.

FIG. 1 shows a typical ultrasonic imaging system (the emission part is not shown because of little relevance to this invention). A conventional imaging process is as follows. The probe emitting a pulse, each matrix element used for receiving receives the echoes, which, having been amplified and A/D converted, are then added in different time-delay amount to obtain the radio frequency(RF) data in the beam former. The RF data (i.e., x(t) hereinafter), divided into path I and Q, enters into the quadrature demodulation device, and then to B signal processing module, Color(or Colorflow) signal processing module or Doppler signal processing module depending on different imaging modes. Having been processed and converted by a digital scanning converter(DSC), they will be displayed on the screen in the form of comprehensible images. The master CPU is responsible for updating the parameters of each module.

FIG. 2 is a conventional quadrature demodulation device in the ultrasonic imaging system, in which I1, Q1 and I, Q have the same indications as those in the equations (1) and (2) hereinafter. The RF signal output by the beam former is synchronously assigned to two multipliers to be multiplied by the sine table value and cosine table value respectively. The sine table and cosine table values are obtainable from the sine table memory and cosine table memory. The output signals of the multipliers enter low-pass filters, which then pick up corresponding filter parameters from the filter parameter memory based on the depth represented by the input signals The input signals are then filtered by the low-pass filter with selected filter parameters. Thus, the outputs are the quadrature demodulation results.

The ultrasonic wave in the medical equipment is characterized in that the center frequency varies with respect to the depth, so does the signal bandwidth. Corresponding to such characteristics, such a digital quadrature demodulation device is in need that supports the demodulation of signals of which the center frequency and bandwidth are variable. General digital ultrasonic equipments all realize the digital quadrature demodulation by using hardware (i.e., FPGA), and therefore in order for both the center frequency and the bandwidth to vary with respect to the depth (or time), large numbers of parameters need to be stored, which increase the overhead of the memory.

Assuming that the ultrasonic echo signal is expressed as: $x(t)=A(t)\cos(\omega(t)*t+\Phi(t))$, wherein A(t) is a low frequency signal, representing the amplitude variation of the echo with respect to different depth, $\Phi(t)$ represents the frequency of echo, also variable with time, the quadrature demodulation process is realized in two steps:

$$I1(t)=x(t)\times\cos(\omega(t)\times t)=A(t)/2(\cos(\Phi(t))+\cos(2\omega(t)\times t+\Phi(t))) \quad (1)$$

$$Q1(t)=x(t)\times\sin(\omega(t)\times t)=-A(t)/2(\sin(\Phi(t))-\sin(2\omega(t)\times t+\Phi(t))) \quad (1)$$

(2) As seen from the above two equations, I1(t) and Q1(t) each consist of two parts of signals, that is, a low-frequency signal with the frequency close to 0 and a high-frequency signal with the frequency close to 2 ω(t). The I1(t) and Q1(t) are respectively sent to low-pass filters to filter out high-frequency components. If the unit impulse response of the filter is represented as h(t), the following expressions are obtained:

$$I(t)=I1(t)\otimes h(t)=A(t)/2\times\cos(\Phi(t))$$

$$Q(t)=Q1(t)\otimes h(t)=A(t)/2\times\sin(\Phi(t)). \quad (2)$$

I and Q are the quadrature demodulation results. That is, after quadrature demodulating, the signals are divided into paths I and Q orthogonal to each other, wherein I and Q represent in-phase and quadrature respectively, and these two paths of signals mainly contain the low-frequency components of the original signals.

The modulus of I and Q, apparently A(t)/2, i.e., the amplitude information(envelope) of the original signal, is the base of type B imaging. With different calculations on the basis of I and Q, blood stream information concerning the diagnostic object will be obtained.

In an all-digital ultrasonic equipment, the quadrature demodulation is typically implemented by means of digital processing methods, wherein the equations employed to describe the above principle are expressed in digital form. As seen from above, the parameters concerning the quadrature demodulation include a sine table, a cosine table, and low-pass filter parameters. In an ordinary system, these parameters are all stored in a memory, and much more parameters are demanded because the demodulation frequency as well as the bandwidth should be variable.

Assuming that the AD sampling rate of the system is 40M; the desired detection depth is 30 cm; the sine table and cosine table length needed to store are approximately 16000 points; and the quantization precision of the quadrature demodulation, which generally should be higher, is 16 bit, then the memory space of the sine and cosine table should be 16000×2×16=512 Kbit. Assuming that the low-pass filter used for demodulating is 100 orders (higher orders may be desired in actual conditions); the bit width is 12 bit; and a set of filter parameters should be switched once every 64 sampling points (for meeting the bandwidth variable with respect to the depth), then a memory space of (16000/64)×50×12=150 Kbit is desirable. On one hand, such a design asks for additional memory chips in the system, and meanwhile increases the cost. On the other hand, the control thereof is rather complicated.

SUMMARY OF THE INVENTION

The object of the invention is to provide a real-time digital quadrature demodulation method and device for the ultrasonic imaging system, which significantly saves memory spaces while satisfying the ultrasonic imaging system requirements.

According to a first aspect of the present invention, a real-time digital quadrature demodulation method for the ultrasonic imaging system is provided, comprising the following steps of: generating sine table value and cosine table value in real time; multiplying signals synchronously assigned to two multipliers by the sine table value and the cosine table value respectively; generating corresponding filter parameters in real time to filter signals from the multipliers; and filtering the signals from the multipliers using corresponding filter parameters based on the depth represented by the signals from the multipliers, so as to output a quadrature demodulation result.

According to the first aspect of the present invention, the sine and cosine table generation comprises the following steps of: generating a read address for reading data from a memory by a counter; adding the data read from the memory to those in an accumulator, with the sum being an input angle of a CORDIC module; and generating sine and cosine values by the CORDIC module.

According to the first aspect of the present invention, the filter parameter generation comprises the steps of: looking up a table in a first memory storing Wei_Win(n) values using a current coefficient index n, so as to obtain a $H_a$ value relevant to a window function; looking up a sine look-up-table stored in a second memory using a sine look-up-table address to obtain a sine value $S_n$; and multiplying $H_a$ value by the sine value $S_n$ to obtain a filter parameter corresponding to the current index. The generation of the look-up-table address comprises the step of: transforming the current coefficient index n into $T_n=2n-N+1$, and then multiplying the Tn value by a filter cutoff frequency k to obtain the look-up-table address, wherein N is the filter order, n=0,1, ..., N−1.

Alternatively, the cutoff frequency k is constant, k being a value of cutoff frequency quantized by 2 pi/M, wherein M is an integral power of 2.

Still alternatively, the cutoff frequency k varies with time. The generation of the cutoff frequency k variable with time comprises the steps of: looking up a table in a third memory storing cutoff frequency variations using a value from the counter to obtain a current cutoff frequency variation $A_c$; and adding the $A_c$ value to a previous filter cutoff frequency $K_{D-1}$ stored in a register Reg to obtain a current cutoff frequency $K_D$.

According to a second aspect of present invention, a real-time digital quadrature demodulation device for the ultrasonic imaging system is provided, comprising: a sine and cosine table generating module for generating the sine and cosine table in real time; two multipliers for multiplying RF signals by a sine table value and a cosine table value respectively; a filter parameter generating module for generating filter parameters in real time to filter signals from the multipliers; two filters for filtering the signals from the multipliers using corresponding filter parameters, based on the depth represented by the signals from the multipliers, so as to output a quadrature demodulation result; and two parameter memories, which are respectively coupled to the sine and cosine table generating module and the filter parameter generating module, useful for respectively storing input parameters desirable for real-time generation of the sine and cosine table and real-time generation of corresponding filter parameters.

According to the second aspect of the present invention, the sine and cosine table generating module comprises: a memory for storing angle data; a first counter for generating a read address for reading the data from the memory; a first adder for adding the data read from the memory and those in the accumulator; and a CORDIC module for taking the sum from the adder as an input angle to generate sine and cosine values.

According to the second aspect of the present invention, the filter parameter generating module comprises: a first memory for storing Wei_Win(n) values, so as to look up a table in the first memory using the current coefficient index n and obtain a $H_a$ value relevant to the window function; a sine look-up-table address generating module for generating the sine look-up-table address; a second memory for storing sine look-up-table, so as to look up the table stored in the second memory using a sine look-up-table address and obtain a sine value $S_n$; and a first multiplier for multiplying $H_a$ value by the sine value $S_n$ to obtain the filter parameters corresponding to the current coefficient index.

The sine look-up-table address generating module herein further comprises: a transformer for transforming the current coefficient index n into $T_n=2n-N+1$, wherein N is the filter order, n=0,1, ... ,N−1; and a second multiplier for multiplying $T_n$ value by the filter cutoff frequency k, so as to obtain the sine look-up-table address. The cutoff frequency k is constant, k being a value of cutoff frequency quantized by 2 pi/M, wherein M is an integer power of 2.

Alternatively, the real-time digital quadrature demodulation device, according to the second aspect of the present invention, further comprises a cutoff frequency controlling module for generating the cutoff frequency k variable with time. The cutoff frequency controlling module further comprises: a third memory for storing cutoff frequency variations; a second counter for looking up a table in the third memory to obtain the current cutoff frequency variation $A_c$; a register for registering the previous filter cutoff frequency $K_{D-1}$; and a second adder for adding $A_c$ value to the previous filter cutoff frequency $K_{D-1}$ so as to obtain the current cutoff frequency $K_D$.

Preferably, the counter is a uniform counter; the filter is a low-pass filter; the memory, first memory and third memory are RAMs; and the second memory is a ROM.

The real-time digital quadrature demodulation method and device for the ultrasonic imaging system according to the present invention effectively save memory resources, and are easily controllable.

DETAILED DESCRIPTION OF THE INVENTION

Real-Time Digital Quadrature Demodulation Method

In this embodiment, the real-time digital quadrature demodulation method for the ultrasonic imaging system comprises: a multiplying step, a filtering step, a sine and cosine table generating step, and a filter parameter generating step. Hereinafter, methods of real-time generation of the sine and cosine table and real-time generation of the filter parameters will be described in details.

1. Method of Real-Time Generation of a Sine and Cosine Table

The cosine table and the sine table are denoted as cosLut[i] and sinLut[i], wherein i=0~L-1, and L represents the maximum desired length, identical to the greatest possible signal (i.e., RF signal) length. If the sampling rate is 40M and the detection depth is 30 cm, then L is about 16000. In this case, the principle of real-time generation of the sine and cosine table with the hardware is expressed as:

assume $$\omega_0 = 0$$

$$\omega_{i+1} = \omega_i + \Delta\theta_k \qquad (3)$$

then $$\cos Lut[i] = \cos(\omega_i) \qquad$$

$$\sin Lut[i] = \sin(\omega_i) \qquad (4)$$

Both the $\cos(\omega_i)$ and the $\sin(\omega_i)$ may be worked out by a CORDIC (coordinate rotation digital computer) design which is commonly used for a digital circuit. In the above equations, $\Delta\theta_k$ is a relevant parameter used by the sine and cosine table generating module. If it is a sine and cosine table representing a single-frequency that is desired, $\Delta\theta_k$ is a constant, which may be changed to generate a sine and cosine table representing a different single-frequency. If a sine and cosine table with a frequency variable with time is desired, $\Delta\theta_k$ value is only required to be relevant to i (i.e., time). $\Delta\theta_k$ is switched at certain intervals(in a typical embodiment, $\Delta\theta_k$ is switched once every 64 sampling points). Whereby, the resultant sine and cosine table frequency will be changeable with time.

Figure 1:
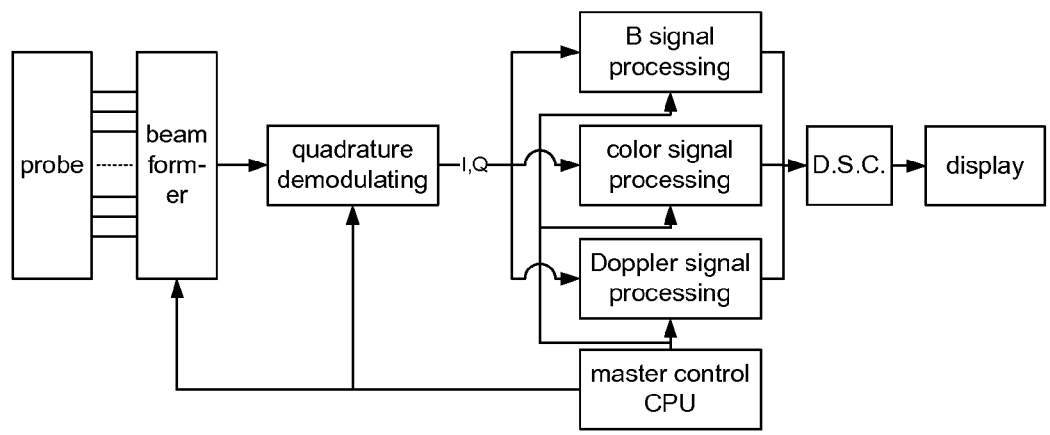
FIG. 1 illustrates a structural block diagram of a typical ultrasonic imaging system.
Figure 2:
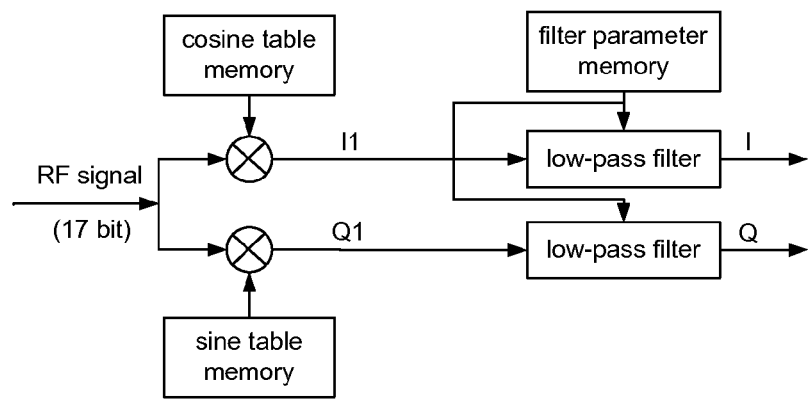
FIG. 2 illustrates a structural block diagram of a conventional quadrature demodulation device.
Figure 3:
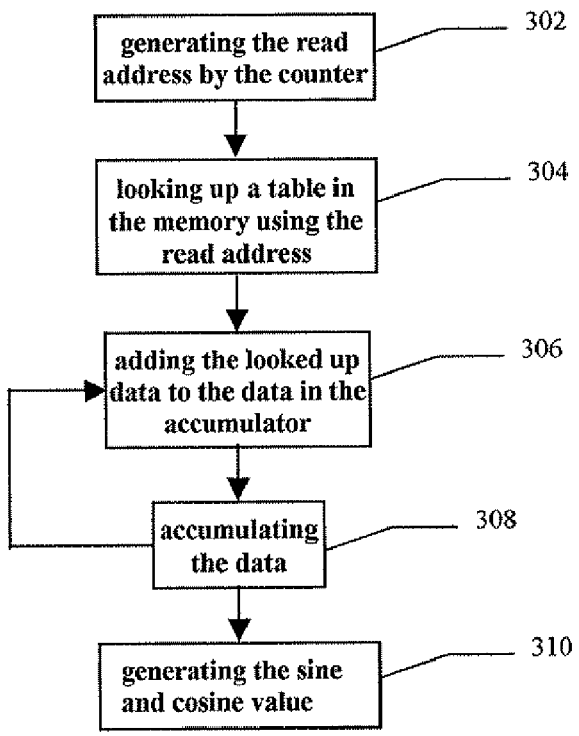
FIG. 3 illustrates a flowchart of generating the sine and cosine table in accordance with the present invention.

FIG. 3 illustrates a flowchart of the sine and cosine table generation. The generation comprises the following steps of: generating a read address for reading the data in the memory storing $\Delta\theta_k$ by using a counter (step 302); looking up tables in the memory using the read address (step 304); adding the read angle_ram data to those in the accumulator (step 306); storing the sum for future use (step 308), and meanwhile taking that sum as an input angle of the CORDIC module, and finally generating the sine and cosine value by CORDIC module (step 310). By using such a hardware-based method of real-time generation of a sine and cosine table, the memory space can be reduced to ½ D (D represents switching $\Delta\theta_k$ once every D points) of that taken up by storing the sine and cosine table directly. If implemented in logic, only built-in RAMs in the logic device suffice.

2. Method of Real-Time Generation of Filter Parameters

Assuming that the order of the low-pass sampling filter is N (N is an even number), and there are totaling N filter parameters, represented as h(n), the equation for calculating the filter parameters using a window function is:

$$h(n) = \sin\left[\left(n - \frac{N-1}{2}\right)\omega_c\right] \times \frac{Win(n)}{pi(n - (N-1)/2)}, n = 0, 1 \ldots N-1; \qquad (5)$$

wherein, $\omega_c$ is the cutoff frequency (i.e., the cutoff angle frequency) of the low-pass filter, and Win(n) is the window function, such as general hamming, hanning, Gaussian window etc. If $\omega_c$ is assured to be k×2 pi/M wherein k=0~M-1, M is an integer power of 2, such as 256, then the product term on the left of the multiplication sign in the above equation could be obtained by looking up a sine look-up-table with the length of M (storing sine values of M angles equally divided from 0 to pi).

Suppose $\omega_c$ is k×2 pi/M (k represents the cutoff angle frequency quantized by 2 pi/M), then $$\sin\left[\left(n - \frac{N-1}{2}\right)\omega_c\right] = \sin[(2n - N + 1) \times k \times pi/M] \qquad (6)$$

(2n−N+1)*k is calculated at the very beginning of the table look-up, and then the result concerned, either positive or negative, is maintained as low log 2(M) bit. Thereby, the low log 2(M)−1 bit in the log 2(M) bit is taken as the look-up address. If the most significant bit is 0, the data at the corresponding address is the desired sine value; if the most significant bit is 1, the negative value of the data at corresponding address is the desired sine value. Such design employs the odd symmetry of the sine function. If the stored values relate to all the angles from 0~2 pi, then it does not have to rely on the odd symmetry.

The product item on the right side of the multiplication sign in equation (5) is indicated as Wei_Win(n), wherein n=0, 1, . . . ,N−1. Wei_Win(n) can be calculated in advance by softwares and stored in the RAM, or alternatively values of Wei_Win(n) corresponding to different n can be obtained by looking up a table. Twice table look-up and one multiplication are sufficient to arrive at one filter parameter.

Figure 4:
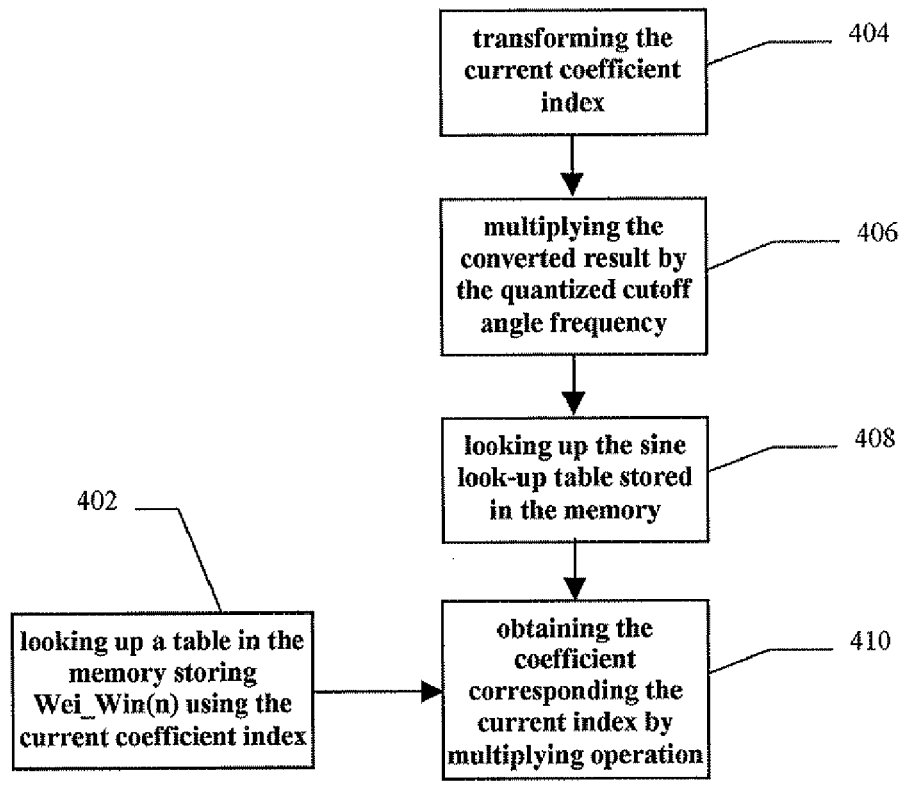
FIG. 4 illustrates a flowchart of real-time calculation of filter parameters in accordance with the present invention.

FIG. 4 illustrates a flowchart of real-time calculation of filter parameters. The above Wei_Win(n) is stored in one memory (RAM), and the sine look-up-table in another memory(ROM). By looking up a table in the RAM using the current coefficient index n, the window function value $$H_a (\text{i.e.,} \frac{Win(n)}{pi(n - (N-1)/2)})$$

in the equation (5)) corresponding to the index n is obtained (step 402). The $T_n = 2n − N + 1$ value transferred via the current coefficient index n is multiplied by the quantized filter cutoff frequency k (step 406) to arrive at the look-up address, which is then used to look up the table in the ROM (step 408) to obtain the sine value $S_n$. $H_a$ is finally multiplied by the sine value $S_n$ (step 410) to obtain the coefficient Coe corresponding to the current index n.

In the above process of generating filter parameters, the cutoff frequency of the filter is constant (k signifies a value of cutoff frequency quantized by 2 pi/M. As mentioned above, the quadrature demodulation device in the ultrasonic equipment requires the bandwidth variable, i.e., the cutoff frequency $\omega_c$ of the filter is variable. The $\omega_c$ corresponding to different depths may be stored in the memory. When demodulating different depth signals, the filter parameter calculating module takes out corresponding $\omega_c$ calculation parameters from the memory and delivers the parameters to the filter module, and thus the quadrature demodulation device with variable bandwidth is realized The filter parameters real-time calculation hardware need store Wei_Win(n) and $\omega_c$ as corresponding to different depths. The memory space taken up thereby is almost neglectable as compared with that of the total amount of N/2 filter parameters corresponding to different depths.

Figure 5:
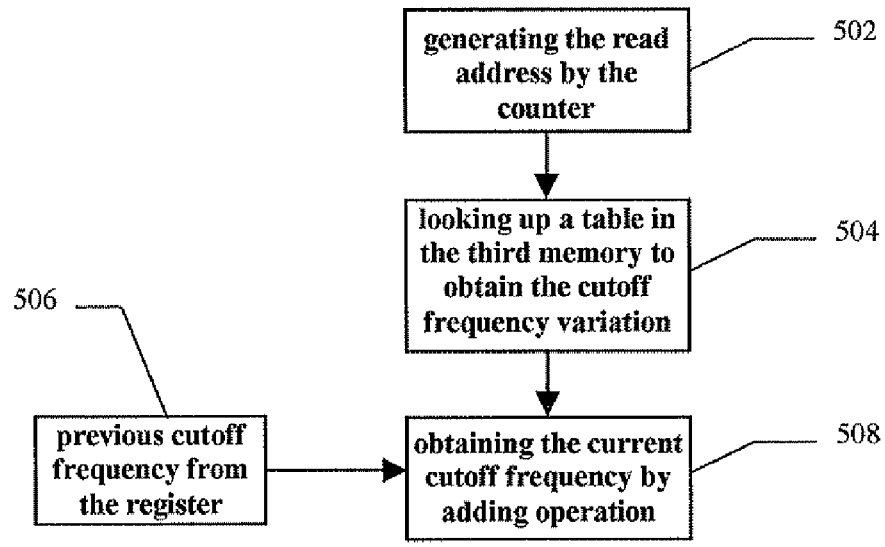
FIG. 5 illustrates a flowchart of generating the cutoff frequency variable with time in accordance with the present invention.

FIG. 5 illustrates a flowchart of generating a cutoff frequency variable with time. The cutoff frequency variation is stored in a memory (Accum RAM) (in the case where the cutoff frequency changes slowly, the storage space can be saved by storing the variation than directly storing the cutoff frequency), and the previous filter cutoff frequency is stored in a register(Reg). A look-up in the Accum RAM (step 504) using the value generated by a uniform counter (step 502) arrives at the current cutoff frequency variation $A_c$. $A_c$ plus the previous filter cutoff frequency $K_{D-1}$ stored (step 506) in the Reg (step 508) leads to the current cutoff frequency $K_D$. The method of generating filter parameters using the cutoff frequency $K_D$ variable with time is completely the same as that shown in FIG. 4. Therefore, generation of filter parameters with the cutoff frequency variable with time is realized.

The method for real-time calculation of low-pass filter parameters according to the present invention is extensible to the real-time calculation of parameters concerning the band-pass and high pass filters.

Quadrature Demodulation Device

Figure 6:
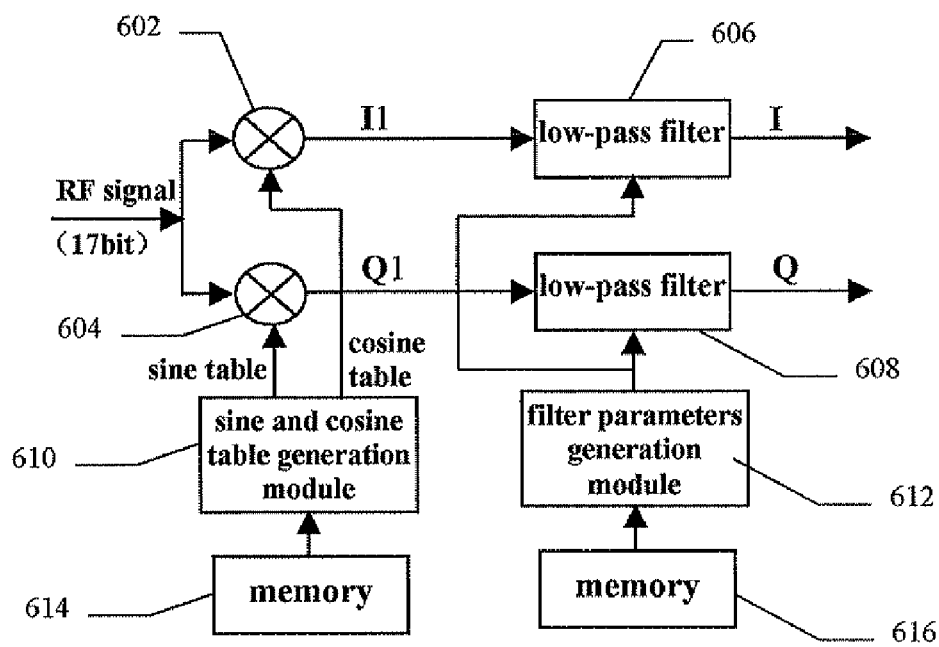
FIG. 6 illustrates a structural block diagram of the quadrature demodulation device in accordance with the present invention.

FIG. 6 illustrates a structural block diagram of the quadrature demodulation device of this embodiment. The quadrature demodulation device according to this embodiment comprises: two multipliers 602 and 604 used for multiplying RF signal by the sine and cosine table values respectively; two filters 606 and 608 used for filtering signals from the multipliers using the corresponding filter parameters, based on the depths represented by the signals from the multipliers 602 and 604, so as to output the quadrature demodulation result; a sine and cosine table generating module 610, used for real-time generation of a sine and cosine table; a filter parameter generating module 612 used for realtime generation of corresponding filter parameters to filter the signals from the multipliers; and two parameter memories 614 and 616, which are respectively coupled to the sine and cosine table generating module 610 and a filter parameter generating module 612, useful for respectively storing input parameters desirable for the real-time generation of the sine and cosine table and real-time generation of corresponding filter parameters. In the quadrature demodulation device of this embodiment, a dedicated sine and cosine table generating module and a filter parameter generating module (implemented in digital logic circuits in one specific embodiment) are employed, rather than the sine table memory, the cosine table memory and low-pass filter parameter memory. These modules also demand some input parameters, which are stored in the parameter memories 614 and 616 shown in FIG. 6. Due to a rather small amount of input parameters, a dedicated exterior memory is not required.

Hereunder, the structures of generating the sine and cosine table and filter parameters, used in the quadrature demodulation device according to the present invention, will be discussed in great details.

Figure 7:
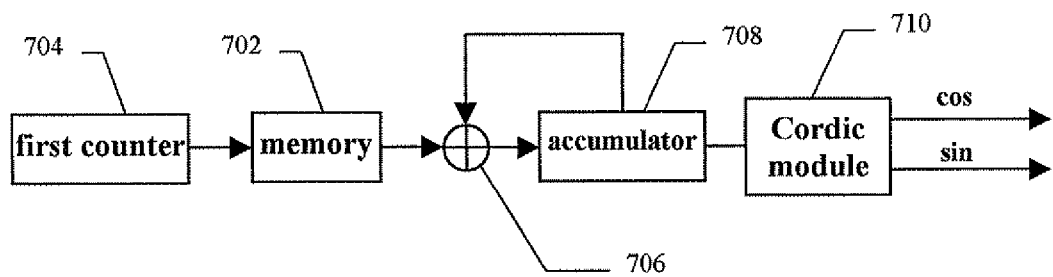
FIG. 7 illustrates a structural block diagram of generating the sine and cosine table in accordance with the present invention.

FIG. 7 illustrates a structural block diagram of generating a sine and cosine table. The sine and cosine table generating module comprises: a memory 702, a first counter 704, a first adder 706, an accumulator 708, and a CORDIC module 710. The first counter 704 generates a read address for reading data from the memory 702 storing $\Delta\theta_k$. The first adder 706 adds angle_ram data read from the memory 702 to those in the accumulator 708. The result as obtained is then taken as the input angle of the CORDIC module 710, which module then generates the sine and cosine value. By using such a hardware-based method of real-time generation of the sine and cosine table, the memory space taken up thereby can be reduced to ½ D (D represents switching $\Delta\theta_k$ once every D points) of that by directly storing the sine and cosine table. If implemented in logic, only the built-in RAMs in the logic device are necessary.

Figure 8:
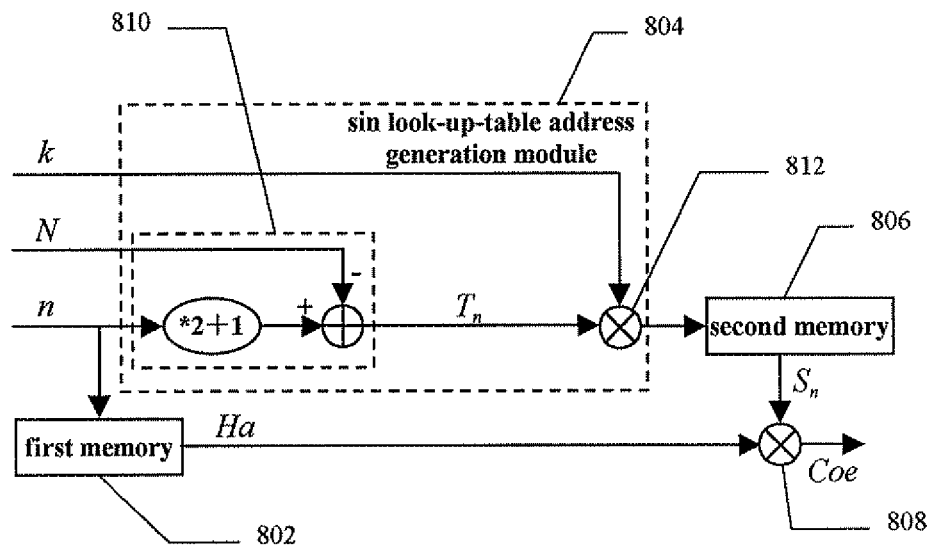
FIG. 8 illustrates a structural block diagram of real-time calculation of the filter parameters with a constant cutoff frequency in accordance with the present invention.

FIG. 8 illustrates a structural block diagram of real-time calculation of filter parameters with a constant cutoff frequency. The filter parameter generating module comprises: a first memory (RAM) 802, a sine look-up-table address generating module 804, a second memory (ROM) 806, and a first multiplier 808. Wei_Win(n) mentioned above is stored in the first memory (RAM) 802, and the sine look-up-table is stored in the second memory (ROM)806. Look-up in the first memory (RAM) 802 using the current coefficient index n arrives at $H_a$ relevant to the window function. The sine look-up-table address generating module 804 looks up the table in the second memory (ROM) 806 to obtain a sine value $S_n$. The first multiplier 808 multiplies the $H_a$ by the sine value $S_n$ to obtain a coefficient Coe corresponding to the current index i. The sine look-up-table address generating module 804 comprises a transformer 810 and a second multiplier 812. The sine look-up-table address generating module 804 may, for example, multiple the $T_n$ ($T_n$=2n−N+1) converted via the current coefficient index n by the quantized cutoff frequency k to obtain the look-up address.

Figure 9:
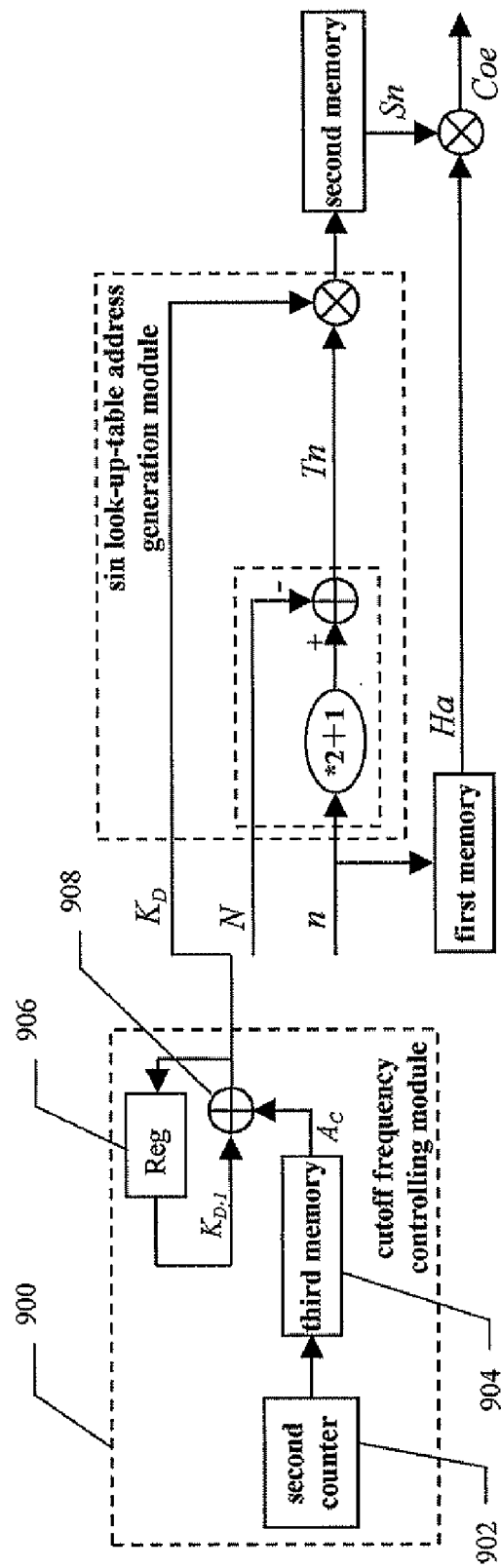
FIG. 9 illustrates a structural block diagram of real-time calculation of the filter parameters with a variable cutoff frequency in accordance with the present invention.

FIG. 9 illustrates a structural block diagram of real-time generation of filter parameters with a variable cutoff frequency. As compared with the hardware structure for real-time calculation of filter parameters with a constant cutoff frequency, the structure concerned includes an additional cutoff frequency controlling module 900 for generating a cutoff frequency variable with time. The module 900 may, for example, comprises a second counter 902, a third memory (Accum RAM) 904, a register (Reg) 906, and an adder 908. The third memory (Accum RAM) 904 stores the cutoff frequency variation(in the case where the cutoff frequency changes slowly, the storage space can be saved by storing the variation than directly storing the cutoff frequency). The second counter 902 is a uniform counter, the value from which is used to look up a table in the third memory (Accum RAM)904 to obtain the current cutoff frequency variation $A_c$. The $A_c$ value plus the previous filter cutoff frequency $K_{D-1}$ stored in the register (Reg) 906 obtains the current cutoff frequency $K_D$. The rest parts of the hardware construction for calculating the filter parameters by using the cutoff frequency $K_D$ are completely the same as those shown in FIG. 8.

In the present embodiments, the counter is a uniform counter, and the filter is a low-pass filter.

Although particular embodiments of the present invention have been shown and described, the present invention is not limited to these specific embodiments. The terms used in the specification and claims of this invention, such as "the first", "the second", "the third" etc., are illustrative only and are not intended to limit the present invention.

What is claimed is:

1. A real-time digital quadrature demodulation method for a ultrasonic imaging system, comprising the steps of:
   generating sine table value and cosine table value in real time;
   multiplying signals synchronously assigned to two multipliers by the sine table value and the cosine table value respectively;
   generating corresponding filter parameters in real time to filter signals from the multipliers; and
   filtering the signals from the multipliers using corresponding filter parameters based on the depth represented by the signals from the multipliers, so as to output a quadrature demodulation result.

2. The method of claim 1, wherein the sine and cosine table generation comprising the steps of:
   generating a read address for reading data from a memory by a counter;
   adding the data read from the memory to those in an accumulator, with the sum being an input angle of a CORDIC (coordinate rotation digital computer) module; and
   generating sine and cosine values by the CORDIC module.

3. The method of claim 1, wherein the filter parameter generation comprising the steps of:
   looking up a table in a first memory storing Wei_Win(n) values using a current coefficient index n, so as to obtain a $H_a$ value relevant to a window function, Win(n), wherein Wei_Win(n) is calculated by $$\frac{Win(n)}{pi\left(n - \frac{N-1}{2}\right)}, n = 0, 1 \ldots N-1;$$

looking up a sine look-up-table stored in a second memory using a sine look-up-table address to obtain a sine value $S_n$; and
   multiplying $H_a$ value by the sine value $S_n$ to obtain a filter parameter corresponding to the current index.

4. The method of claim 3, wherein the sine look-up-table address generation comprises the step of:
   transforming the current coefficient index n into $T_n=2n-N+1$, and then multiplying the Tn value by a filter cutoff frequency k to obtain the sine look-up-table address, wherein N is the filter order, n=0.1, . . . ,N−1.

5. The method of claim 4, wherein the cutoff frequency k is constant, k being a value of cutoff frequency quantized by 2 pi/M, wherein M is an integral power of 2.

6. The method of claim 4, wherein the cutoff frequency k varies with time, and the generation of the cutoff frequency k variable with time comprises the steps of
   looking up a table in a third memory storing cutoff frequency variations using a value from a counter to obtain a current cutoff frequency variation $A_c$; and
   adding the $A_c$ value to a previous filter cutoff frequency $K_{D-1}$ stored in a register Reg to obtain a current cutoff frequency $K_D$.

7. A real-time digital quadrature demodulation device for a ultrasonic imaging system, comprising:
   a sine and cosine table generating module for generating the sine and cosine table in real time;
   two multipliers for multiplying RF signals by a sine table value and a cosine table value respectively;
   a filter parameter generating module for generating filter parameters in real time to filter signals from the multipliers;
   two filters for filtering the signals from the multipliers using corresponding filter parameters, based on the depth represented by the signals from the multipliers, so as to output a quadrature demodulation result; and
   two parameter memories, which are respectively coupled to the sine and cosine table generating module and the filter parameter generating module, useful for respectively storing input parameters desirable for real-time generation of the sine and cosine table and real-time generation of corresponding filter parameters.

8. The device of claim 7, wherein the sine and cosine table generating module comprises:
   a memory for storing angle data;
   a first counter for generating a read address for reading the data from the memory;
   a first adder for adding the data read from the memory and those in the accumulator; and
   a CORDIC (coordinate rotation digital computer) module for taking the sum from the adder as an input angle to generate sine and cosine values.

9. The device of claim 8 wherein the counter is a uniform counter.

10. The device of claim 8, wherein:
    the memory is a RAM.

11. The device of claim 7, wherein the filter parameter generating module comprises:
    a first memory for storing Wei_Win(n) values, so as to look up a table in the first memory using the current coefficient index n and obtain a $H_a$ value relevant to the window function, Win(n), wherein Wei_Win(n) is calculated by $$\frac{Win(n)}{pi\left(n - \frac{N-1}{2}\right)}, n = 0, 1 \ldots N-1;$$

a sine look-up-table address generating module for generating the sine look-up-table address;
    a second memory for storing sine look-up-table, so as to look up the table in the second memory using a sine look-up-table address and obtain a sine value $S_n$; and
    a first multiplier for multiplying $H_a$ value by the sine value $S_n$ to obtain the filter parameters corresponding to the current coefficient index.

12. The device of claim 11, wherein the sine look-up-table address generating module comprises:
    a transformer for transforming the current coefficient index n into $T_n=2n-N-1$ wherein N is the filter order, n=0, 1, . . . ,N−1; and a second multiplier for multiplying Tn value by a filter cutoff frequency, so as to obtain the sine look-up-table address.

13. The device of claim 12, wherein:
    the cutoff frequency k is constant, k being a value of cutoff frequency quantized by 2 pi/M, wherein M is an integer power of 2.

14. The device of claim 12, further comprising:
    a cutoff frequency controlling module for generating the cutoff frequency k variable with time;
    wherein the cutoff frequency controlling module further comprises:

a third memory for storing cutoff frequency variations;

a second counter for looking up a table in the third memory to obtain the current cutoff frequency variation $A_c$;

a register for registering the previous filter cutoff frequency $K_{D-1}$;

a second adder for adding $A_c$ value to the previous filter cutoff frequency $K_{D-1}$ so as to obtain the current cutoff frequency $K_D$.

15. The device of claim 14 wherein:

the first memory and the third memory are RAMs; and the second memory is a ROM.

16. The device of claim 7, wherein at least one filter is a low-pass filter.

\* \* \* \* \*